US011322988B1

(12) United States Patent
Chakraborty et al.

(10) Patent No.: US 11,322,988 B1
(45) Date of Patent: May 3, 2022

(54) LOW POWER TRANSMITTER FOR SENSOR ARRAYS

(71) Applicant: INTERNATIONAL BUSINESS MACHINES CORPORATION, Armonk, NY (US)

(72) Inventors: Sudipto Chakraborty, Plano, TX (US); Rajiv Joshi, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/172,238

(22) Filed: Feb. 10, 2021

(51) Int. Cl.
H02J 50/20 (2016.01)
H03D 7/12 (2006.01)
H02M 3/155 (2006.01)
H02J 50/50 (2016.01)

(52) U.S. Cl.
CPC ............ H02J 50/20 (2016.02); H02J 50/502 (2020.01); H02M 3/155 (2013.01); H03D 7/125 (2013.01)

(58) Field of Classification Search
CPC ........ H02J 50/20; H02J 50/502; H02M 3/155; H03D 7/125
USPC .......................................................... 307/31
See application file for complete search history.

(56) References Cited

U.S. PATENT DOCUMENTS 6,472,934 B1   10/2002  Pehlke
8,050,638 B2   11/2011  Vinayak et al.
8,699,974 B2    4/2014  Mo et al.
2005/0272398 A1* 12/2005 Chang ................. H03D 7/1491
                                                              455/326
2011/0007843 A1  1/2011  Khorram et al.

FOREIGN PATENT DOCUMENTS

WO    2011102762 A1    8/2011

OTHER PUBLICATIONS

Jeong et al., "A 20 GB/s 0.4 pJ/b Energy-Efficient Transmitter Driver Utilizing Constant-Gm Bias", IEEE Journal of Solid-State Circuits. vol. 51, No. 10. Oct. 2016.
Karam et al., "A 6.3 GHz BFSK Transmitter with On-Chip Antenna for Self-Powered Medical Sensor Applications", 2007 IEEE Radio Frequency Integrated Circuits Symposium. Jun. 3, 2017. pp. 101-104.
Kuang et al. "A Fast-Settling PLL Frequency Synthesizer with Direct Frequency Presetting", 2006 IEEE International Solid-State Circuits Conference. Feb. 7, 2006. pp. 1-10.

(Continued)

Primary Examiner — Hal Kaplan
(74) Attorney, Agent, or Firm — Tutunjian & Bitetto, PC; Samuel Waldbaum

(57) ABSTRACT

A low power transmitter includes a low frequency feedback loop, a high frequency switching element embedded within the low frequency feedback loop, and a mixer electrically communicating with the low frequency feedback loop and the high frequency switching element. The low frequency feedback loop employs either a voltage mode interface or a current mode interface. The high frequency switching element includes a first transistor, a second transistor, and a pair of inductive elements. Alternatively, the high frequency switching element includes a single transistor and a single inductive element.

20 Claims, 12 Drawing Sheets

(56) References Cited

OTHER PUBLICATIONS

Mao et al., "A Subgigahertz UWB Transmitter With Wireless Clock Harvesting for RF-Powered Applications", IEEE Transactions on Biomedical Circuits and Systems.—II: Express Briefs. vol. 61, No. 5. May 2014. pp. 314-318.
Praveen et al., "High Linearity Transmit Power Mixers Using Baseband Current Feedback", IEEE Journal of Solid-State Circuits. vol. 55, No. 2. Feb. 2020. pp. 272-281.
Sowlati et al., "A 60-GHz 144-Element Phased-Array Transceiver for Backhaul Application", IEEE Journal of Solid-State Circuits, vol. 53, No. 12. Dec. 2018. pp. 3640-3659.
Zhang et al., "A 2.4-GHz Energy-Efficient Transmitter for Wireless Medical Applications", IEEE Transactions on Biomedical Circuits and Systems. vol. 5, No. 1. Feb. 2011. pp. 39-47.
Mell et al., "The NIST Definition of Cloud Computing", National Institute of Standards and Technology, Special Publication 800-145, Sep. 2011, pp. 1-7.

\* cited by examiner

LOW POWER TRANSMITTER FOR SENSOR ARRAYS

BACKGROUND

The present invention relates generally to signal processing for communication systems, and more specifically, to low power transmitters for powering sensor arrays.

Portable devices such as mobile phones, laptop computers, tablets, and other communication devices often rely on electrical battery energy to conduct communications. Electrical batteries store chemical energy and deliver electrical energy through an electrochemical conversion process. An electrical battery includes one or more cells, organized in an array. Each cell includes an anode, a cathode, and an electrolyte that separates the two electrodes and allows the transfer of electrons as ions between them. A chemical material that originates chemical reactions within the cell is called an active material. In practice, the energy that can be obtained from a cell is fundamentally limited by the quantity of active material included in the cell. Electrical batteries may be non-rechargeable or rechargeable. Although some portable devices may use non-rechargeable batteries, the vast majority depend on rechargeable batteries. Portable devices run on batteries. Display, hard disk, logic, and memory are the device components with the greatest impact on power consumption. However, when a wireless interface is added to a portable system, power consumption increases significantly.

SUMMARY

In accordance with an embodiment, a low power transmitter is provided. The low power transmitter includes a low frequency feedback loop, a high frequency switching element embedded within the low frequency feedback loop, and a mixer electrically communicating with the low frequency feedback loop and the high frequency switching element.

In accordance with another embodiment, a method is provided. The method includes powering a plurality of sensor arrays via a low power transmitter by constructing a low frequency feedback loop, embedding a high frequency switching element within the low frequency feedback loop to switch a baseband current, obtaining radiofrequency (RF) signals at an output of switched local oscillator (LO) stages of the low power transmitter, and electrically connecting a mixer with the low frequency feedback loop and the high frequency switching element to combine multiple phases of the RF signals by electrical or magnetic coupling.

In accordance with yet another embodiment, a mixer is provided. The mixer includes a first feedback loop including a first op amp, a first transistor, a first switch connected between the first op amp and the first transistor, and a first resistive element, a second feedback loop including a second op amp, a second transistor, a second switch connected between the second op amp and the second transistor, and a second resistive element, and a third transistor electrically connected between the first and second resistive elements, such that a first feedback loop is defined with the first op-amp, the first transistor, the first resistive element and the third transistor, and a second feedback loop is defined with the second op-amp, the second transistor, the second resistive element and the third transistor.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
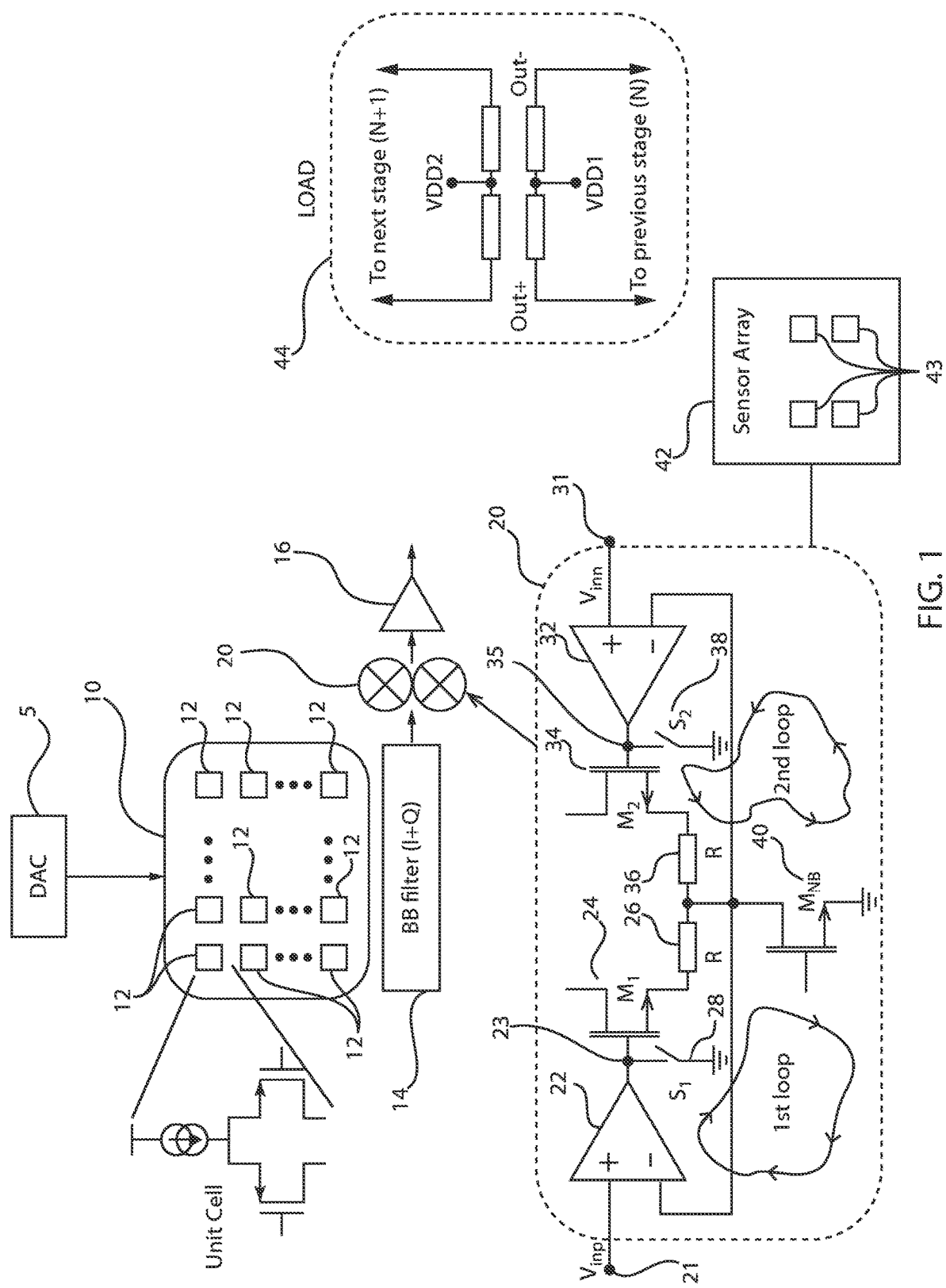
FIG. 1 shows an exemplary low power transmitter, in accordance with an embodiment of the present invention.

Embodiments in accordance with the present invention provide methods and devices for powering sensor arrays with low power transmitters. A mixer is a key component of a wireless transmitter. For low-to-moderate output power, a power mixer can be used to directly drive the antenna. The mixer contributes significantly to power consumption and nonlinearity. Therefore, it is beneficial to realize a mixer with high linearity while maintaining a high power efficiency. The issue is exacerbated by non-constant envelope modulation schemes used to enhance spectral efficiency in modern wireless communication standards such as 3G, 4G-long term evolution (LTE), and wide local area network (WLAN). Complex constellations can tolerate only a low error vector magnitude (EVM) and, therefore, need high linearity. On the other hand, the high peak-to-average power ratio (PAPR) of such signals exacerbates the difficulties in realizing high linearity with high power efficiency. In principle, the best possible efficiency for a given circuit topology can be retained at any power level by scaling the device sizes and bias currents proportionately while maintaining constant voltage swings. This means that impedance levels increase as the output power is reduced. Due to limitations on realizable inductance values and quality factors, impedances cannot be scaled beyond a certain level. This means that, at low power levels, voltage swings (as a fraction of the power supply) are lower and efficiency is degraded.

The exemplary methods and systems employ a low power transmitter where the mixer and the filter components are combined to lower power consumption and enable high linearity of the transmitter, with low voltage swings at the digital-to-analog converter (DAC) output. The exemplary embodiments employ nested functional loops between the baseband and the local oscillator (LO) blocks and use the same transistor for both LO and baseband functionalities. The baseband and LO interface can be in voltage mode or current mode. Additionally, LO switching can be provided using series or shunt paths, differential LO signals can be used from a common mode baseband path, and headroom benefit can be achieved when inductive loads are used. The exemplary embodiments thus achieve high linearity of the transmitter with a low power supply voltage such that current mode or voltage mode interfaces can be used as needed. Power efficiency can be achieved by employing the same blocks for LO and baseband leads.

The exemplary methods and systems further provide for a high efficiency wide bandwidth transmitter including a low frequency feedback loop and a high frequency switching element embedded inside or within the low frequency loop. The high frequency switching element can be single ended or differential. The low frequency input can be in terms of voltage or current. The low frequency feedback loop includes a dominant pole and a nondominant pole and the mixer output can be single sideband or double sideband.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 shows an exemplary low power transmitter, in accordance with an embodiment of the present invention.

The low power transmitter includes a digital-to-analog converter (DAC) 5 in communication with an array 10 of units cells 12, as well as a baseband filter 14, a mixer 20, and an amplifier 16. The mixer 20 of the low power transmitter can be used to power a sensor array 42 including a plurality of sensors 43. The mixer 20 can be used to power any type of electrical load 44. When referring to "low power," the exemplary embodiments of the present invention refer to less than 20 mW power consumption, and usually about 2 mW or less.

The mixer 20 includes a first operational amplifier (op-amp) 22 having an input 21 ($V_{inp}$). The op-amp 22 is connected to a transistor 24. The transistor 24 can be, e.g., an n-type metal oxide semiconductor (NMOS) transistor. The source of the NMOS transistor 24 is connected to a resistive element 26. A switch 28 is connected between the op-amp 22 and the NMOS transistor 24 at point 23. Point 23 can be referred to as a dominant pole.

The mixer 20 further includes a second operational amplifier (op-amp) 32 having an input 31 ($V_{inn}$). The op-amp 32 is connected to a transistor 34. The transistor 34 can be, e.g., an n-type metal oxide semiconductor (NMOS) transistor. The source of the NMOS transistor 34 is connected to a resistive element 36. A switch 38 is connected between the op-amp 32 and the NMOS transistor 34 at point 35. Point 35 can be referred to as a dominant pole.

The resistive elements 26, 36 of the first and second op-amps, respectively, are connected to each other and to an NMOS transistor 40. A first loop is created between the first op-amp 22, the NMOS transistor 24, the resistive element 26, and the NMOS transistor 40. A second loop is created between the second op-amp 32, the NMOS transistor 34, the resistive element 36, and the NMOS transistor 40. The first and second loops can be referred to as feedback loops. The inputs to the op-amps 22, 32 are voltage inputs, and the output of the mixer 20 is current outputs.

The switches $S_1$ and $S_2$ (28, 38) are local oscillator (LO) switching transistors. $M_1$ and $M_2$ (24, 34) are used for both baseband (BB) and radiofrequency (RF) functions. $V_{inp}$ (21) and $V_{inn}$ (31) are analog baseband signals (e.g., 1-100 MHz). Switches S1 and S2 (28, 38) are switched using LO waveforms (e.g., 2.4 GHz/5 GHz).

The exemplary embodiment provides a low power (less than 5 mW), low area transmitter for sensor arrays 42. The interface between the DAC and the mixer in a conventional wireless transmitter is performed using significant voltage swing, which limits the linearity of the transmitter. The exemplary embodiment provides a low impedance current mode interface between the DAC 5 and the mixer 20, thus leading to high linearity of the transmitter, and low voltage swing at the DAC output.

Figure 2:
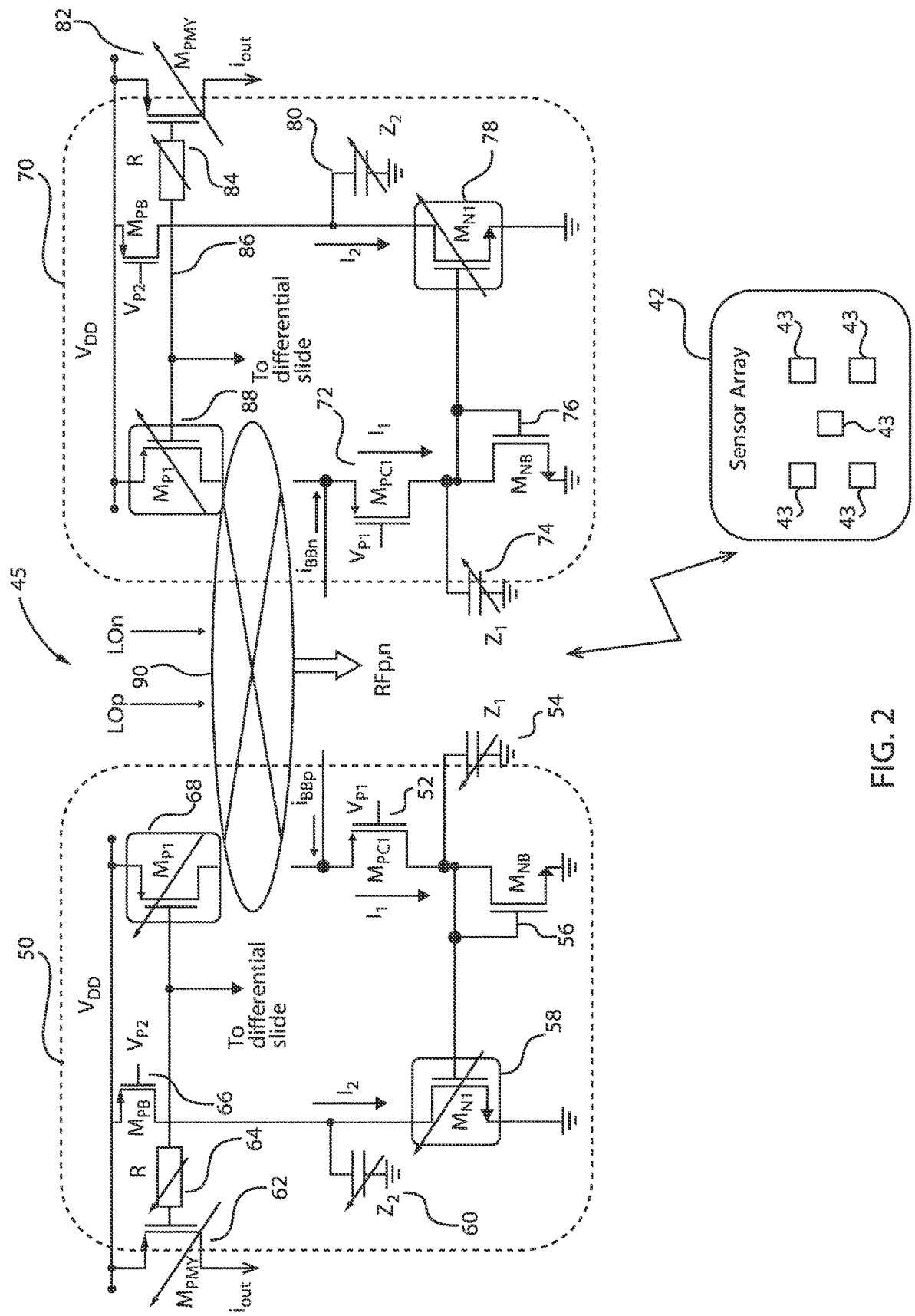
FIG. 2 shows an exemplary low power transmitter, in accordance with another embodiment of the present invention.

FIG. 2 shows an exemplary low power transmitter, in accordance with another embodiment of the present invention.

The low power transmitter 45 includes a positive side 50 and a negative side 70. The positive side 50 can be referred to as the high side or the positive transmitter circuit, whereas the negative side 70 can be referred to as the low side or the negative transmitter circuit. A mixer 90 upconverts the baseband currents in the positive and negative sides 50 and 70, respectively, using the LO clocks, and couples together at the output.

The positive side 50 includes a first transistor 52 ($M_{pc1}$) electrically connected to a second transistor 56 ($M_{NB}$) and an impedance 54 ($Z_1$). The second transistor 56 ($M_{NB}$) is electrically connected to a third transistor 58 ($M_{N1}$). The third transistor 58 ($M_{N1}$) is electrically connected to a second impedance 60 ($Z_2$). The second impedance 60 ($Z_2$) is electrically connected to a fourth transistor 66 ($M_{PB}$), which in turn is electrically connected to a resistive element 64 and a fifth transistor 62 ($M_{PMY}$). The resistive element 64 is electrically connected to a sixth transistor 68. The positive side 50 can be a first loop. The first loop can be referred as a feedback loop. The impedance 54 ($Z_1$) can be referred to as the non-dominant pole or low-impedance output, whereas the second impedance 60 ($Z_2$) can be referred to as the dominant pole or high-impedance output.

The negative side 70 includes a first transistor 72 ($M_{pc1}$) electrically connected to a second transistor 76 ($M_{NB}$) and an impedance 74 ($Z_1$). The second transistor 76 ($M_{NB}$) is electrically connected to a third transistor 78 ($M_{N1}$). The third transistor 78 ($M_{N1}$) is electrically connected to a second impedance 80 ($Z_2$). The second impedance 80 ($Z_2$) is electrically connected to a fourth transistor 86 ($M_{PB}$), which in turn is electrically connected to a resistive element 84 and a fifth transistor 82 ($M_{PMY}$). The resistive element 84 is electrically connected to a sixth transistor 88. The negative side 70 can be a first loop. The second loop can be referred to as a feedback loop. The impedance 74 ($Z_1$) can be referred to as the non-dominant pole or low-impedance output, whereas the second impedance 80 ($Z_2$) can be referred to as the dominant pole or high-impedance output.

The input to the low power transmitter 45 can be either a voltage input or a current input. The low power transmitter 45 can be employed to power, e.g., a sensor array 42 including a plurality of sensors 43. When referring to "low power," the exemplary embodiments of the present invention refer to less than 5 mW power consumption, and usually about 500 W or less.

Figure 3:
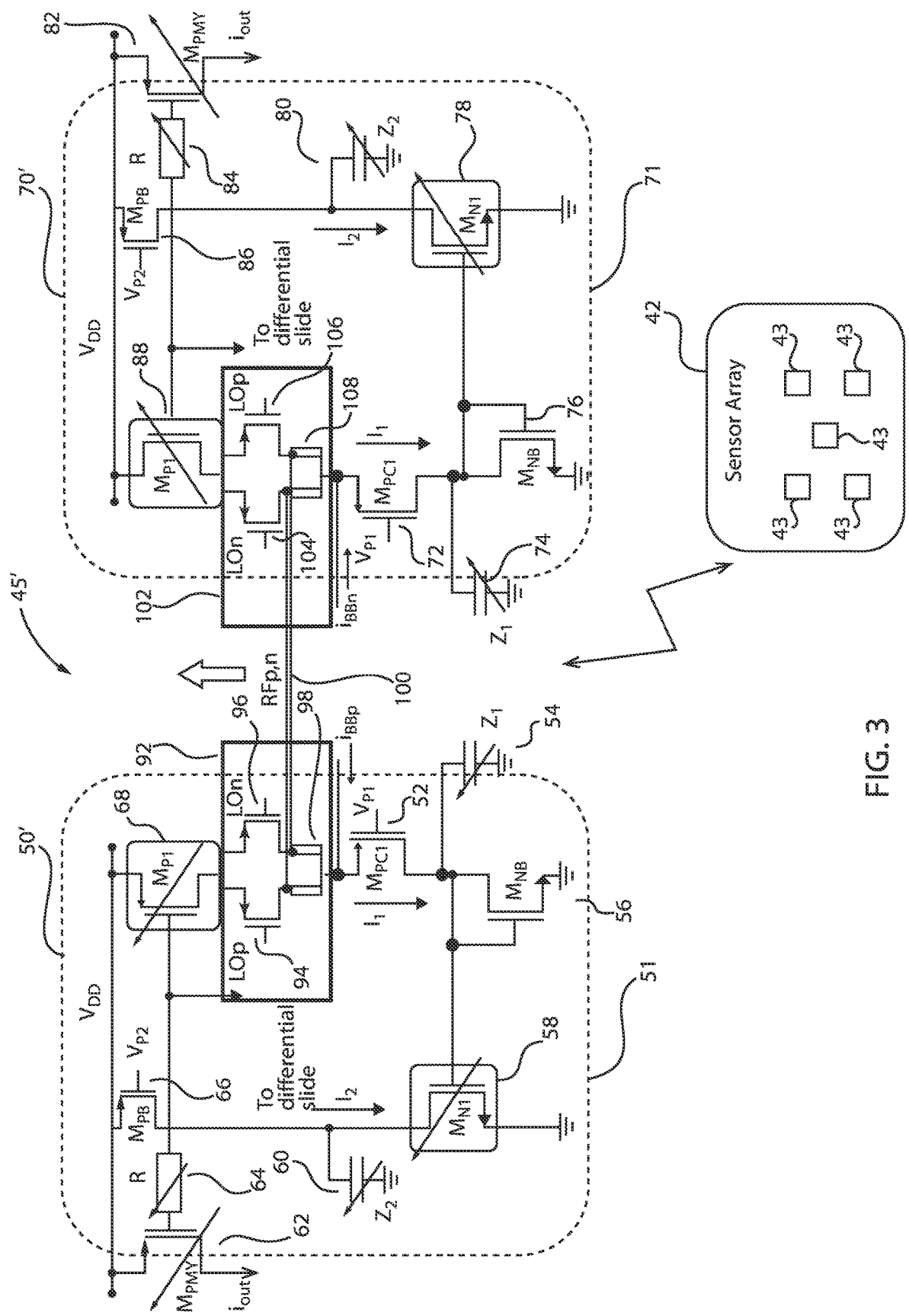
FIG. 3 shows an exemplary low power transmitter, in accordance with another embodiment of the present invention.

FIG. 3 shows an exemplary low power transmitter, in accordance with another embodiment of the present invention.

The low power transmitter 45' includes a positive side 50' and a negative side 70'. The positive side 50' can be referred to as the high side or the positive transmitter circuit, whereas the negative side 70' can be referred to as the low side or the negative transmitter circuit. A connector 100 electrically connects the positive side 50' to the negative side 70' and carries the RF signal.

The positive side 50' includes a first transistor 52 ($M_{pc1}$) electrically connected to a second transistor 56 ($M_{NB}$) and an impedance 54 ($Z_1$). The second transistor 56 ($M_{NB}$) is electrically connected to a third transistor 58 ($M_{N1}$). The third transistor 58 ($M_{N1}$) is electrically connected to a second impedance 60 ($Z_2$). The second impedance 60 ($Z_2$) is electrically connected to a fourth transistor 66 ($M_{PB}$), which in turn is electrically connected to a resistive element 64 and a fifth transistor 62 ($M_{PMY}$). The impedance 54 ($Z_1$) can be referred to as the non-dominant pole or low-impedance output, whereas the second impedance 60 ($Z_2$) can be referred to as the dominant pole or high-impedance output.

Additionally, a switching element or switching component 92 can be incorporated into the positive side 50'. The switching component 92 includes a first transistor 94, a second transistor 96, and a pair of inductive elements 98. The first and second transistors 94, 96 can be p-type metal oxide semiconductor (PMOS) transistors. The switching component 92 can be referred to as an inner loop or a high-frequency loop with respect to the outer loop represented by the dotted line 51. The outer loop 51 can be referred to as the low-frequency loop. The switching component 92 or high-frequency loop is nested within the outer loop 51. The outer loop 51 can be referred to as the feedback loop (lower f), whereas the inner loop or nested loop 92 can be referred to as the open loop (high f). It is noted that the nested loop 92 can be located anywhere within the outer loop 51.

The negative side 70' includes a first transistor 72 ($M_{pc1}$) electrically connected to a second transistor 76 ($M_{NB}$) and an impedance 74 ($Z_1$). The second transistor 76 ($M_{NB}$) is electrically connected to a third transistor 78 ($M_{N1}$). The third transistor 78 ($M_{N1}$) is electrically connected to a second impedance 80 ($Z_2$). The second impedance 80 ($Z_2$) is electrically connected to a fourth transistor 86 ($M_{PB}$), which in turn is electrically connected to a resistive element 84 and a fifth transistor 82 ($M_{PMY}$). The impedance 74 ($Z_1$) can be referred to as the non-dominant pole or low-impedance output, whereas the second impedance 80 ($Z_2$) can be referred to as the dominant pole or high-impedance output.

Additionally, a switching element or switching component 102 can be incorporated into the negative side 70'. The switching component 102 includes a first transistor 104, a second transistor 106, and a pair of inductive elements 108. The first and second transistors 104, 106 can be p-type metal oxide semiconductor (PMOS) transistors. The switching component 102 can be referred to as an inner loop or a high-frequency loop with respect to the outer loop represented by the dotted line 71. The outer loop 71 can be referred to as the low-frequency loop. The switching component 102 or high-frequency loop is nested within the outer loop 71. The outer loop 71 can be referred to as the feedback loop (lower f), whereas the inner loop or nested loop 102 can be referred to as the open loop (high f). It is noted that the nested loop 102 can be located anywhere within the outer loop 71.

The input to the low power transmitter 45' can be either a voltage input or a current input. The low power transmitter 45' can be employed to power, e.g., a sensor array 42 including a plurality of sensors 43. When referring to "low power," the exemplary embodiments of the present invention refer to less than 5 mW power consumption, and usually about 500 µW or less.

Figure 4:
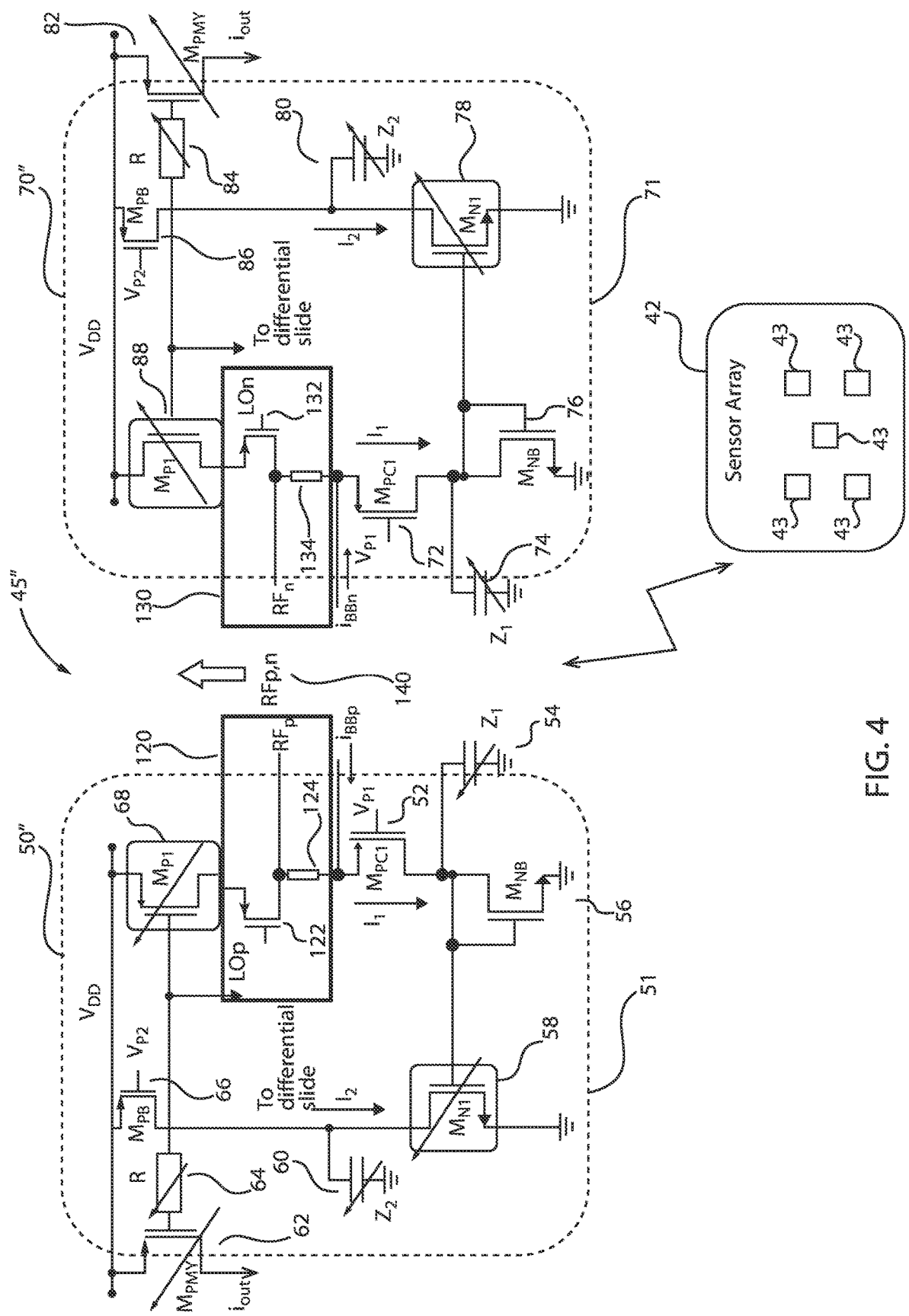
FIG. 4 shows an exemplary low power transmitter, in accordance with another embodiment of the present invention.

FIG. 4 shows an exemplary low power transmitter, in accordance with another embodiment of the present invention.

The low power transmitter 45" includes a positive side 50" and a negative side 70". The positive side 50" can be referred to as the high side or the positive transmitter circuit, whereas the negative side 70" can be referred to as the low side or the negative transmitter circuit. A connector 140 electrically connects the positive side 50" to the negative side 70".

The positive side 50" includes a first transistor 52 ($M_{pc1}$) electrically connected to a second transistor 56 ($M_{NB}$) and an impedance 54 ($Z_1$). The second transistor 56 ($M_{NB}$) is electrically connected to a third transistor 58 ($M_{N1}$). The third transistor 58 ($M_{N1}$) is electrically connected to a second impedance 60 ($Z_2$). The second impedance 60 ($Z_2$) is electrically connected to a fourth transistor 66 ($M_{PB}$), which in turn is electrically connected to a resistive element 64 and a fifth transistor 62 ($M_{PMY}$). The impedance 54 ($Z_1$) can be referred to as the non-dominant pole or low-impedance output, whereas the second impedance 60 ($Z_2$) can be referred to as the dominant pole or high-impedance output.

Additionally, a switching element or switching component 120 can be incorporated into the positive side 50". The switching component 120 includes a transistor 122 and an inductive element 124. The transistor 122 can be a PMOS transistor. The switching component 120 can be referred to as an inner loop or a high-frequency loop with respect to the outer loop represented by the dotted line 51. The outer loop 51 can be referred to as the low-frequency loop. The switching component 120 or high-frequency loop is nested within the outer loop 51. The outer loop 51 can be referred to as the feedback loop (lower f), whereas the inner loop or nested loop 120 can be referred to as the open loop (high f). It is noted that the nested loop 120 can be located anywhere within the outer loop 51.

The negative side 70" includes a first transistor 72 ($M_{pc1}$) electrically connected to a second transistor 76 ($M_{NB}$) and an impedance 74 ($Z_1$). The second transistor 76 ($M_{NB}$) is electrically connected to a third transistor 78 ($M_{N1}$). The third transistor 78 ($M_{N1}$) is electrically connected to a second impedance 80 ($Z_2$). The second impedance 80 ($Z_2$) is electrically connected to a fourth transistor 86 ($M_{PB}$), which in turn is electrically connected to a resistive element 84 and a fifth transistor 82 ($M_{PMY}$). The impedance 74 ($Z_1$) can be referred to as the non-dominant pole or low-impedance output, whereas the second impedance 80 ($Z_2$) can be referred to as the dominant pole or high-impedance output.

Additionally, a switching element or switching component 130 can be incorporated into the negative side 70". The switching component 130 includes a transistor 132 and an inductive element 134. The transistor 132 can be a PMOS transistor. The switching component 130 can be referred to as an inner loop or a high-frequency loop with respect to the outer loop represented by the dotted line 71. The outer loop 71 can be referred to as the low-frequency loop. The switching component 130 or high-frequency loop is nested within the outer loop 71. The outer loop 71 can be referred to as the feedback loop (lower f), whereas the inner loop or nested loop 130 can be referred to as the open loop (high f). It is noted that the nested loop 130 can be located anywhere within the outer loop 71.

The input to the low power transmitter 45" can be either a voltage input or a current input. The low power transmitter 45" can be employed to power, e.g., a sensor array 42 including a plurality of sensors 43. When referring to "low power," the exemplary embodiments of the present invention refer to less than 5 mW power consumption, and usually about 500 µW or less.

The exemplary embodiments of FIGS. 2-4 provide for low power (less than 5 mW), low area transmitters for sensor arrays 42. The interface between the DAC and the mixer in a conventional wireless transmitter is performed using significant voltage swing, which limits the linearity of the transmitter. The exemplary embodiments provide a low impedance current mode interface between the DAC and the mixer, thus leading to high linearity of the transmitter, and low voltage swing at the DAC output. Moreover, the exemplary embodiments of FIGS. 2-4 provide for a high efficiency wide bandwidth transmitter including a low frequency feedback loop and a high frequency switching element embedded inside the low frequency loop. The high frequency switching element can be single ended or differential. The low frequency input can be in terms of voltage or current. The low frequency feedback loop includes a dominant pole and a nondominant pole and the mixer output can be single sideband or double sideband. The typical values for low frequency are 1-20 MHz and that of the high frequency are in the 1-20 GHz range. Therefore, the high frequency switching element pertains to a frequency range of about 1-20 GHz.

Figure 5:
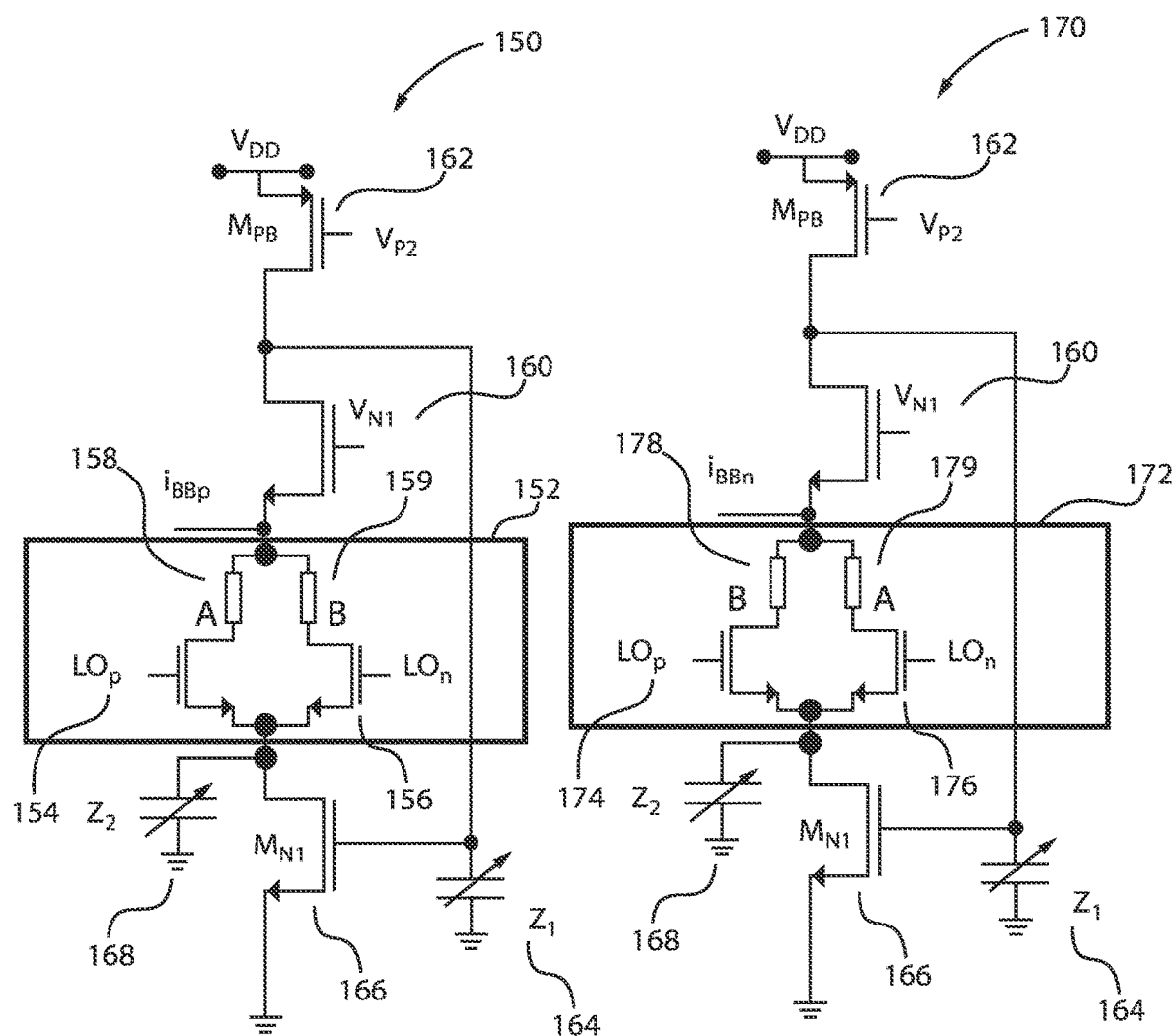
FIG. 5 illustrates a switching element circuit nested within a low-frequency loop, in accordance with an embodiment of the present invention.

FIG. 5 illustrates a switching element circuit nested within a low-frequency loop, in accordance with an embodiment of the present invention.

The circuit 150 can be referred to as a low-frequency loop and includes a switching element or switching component 152 embedded therein. The circuit 150 includes a first transistor 160 electrically connected to a second transistor 162 ($M_{PB}$) on one end of the switching element 152. The circuit 150 further includes a third transistor ($M_{N1}$) 166, as well as a first impedance 164 ($Z_1$) and a second impedance 168 ($Z_2$). The switching element 152 includes a first transistor 154, a second transistor 156, and a pair of inductive elements 158, 159. The first and second transistors 154, 156 of the switching element 152 can be NMOS transistors. The switching element 152 can be referred to as an inner loop or a high-frequency loop with respect to the outer loop. The outer loop can be referred to as the feedback loop (lower f), whereas the inner loop or nested loop 152 can be referred to as the open loop (high f). Thus, the nested loop 152 can be embedded in different areas of the outer loop.

Similarly, the circuit 170 can be referred to as a low-frequency loop and includes a switching element or switching component 172 embedded therein. The circuit 170 includes a first transistor 160 electrically connected to a second transistor 162 ($M_{PB}$) on one end of the switching element 172. The circuit 170 further includes a third transistor ($M_{N1}$) 166, as well as a first impedance 164 ($Z_1$) and a second impedance 168 ($Z_2$). The switching element 172 includes a first transistor 174, a second transistor 176, and a pair of inductive elements 178, 179. The first and second transistors 174, 176 of the switching element 172 can be NMOS transistors. The switching element 172 can be referred to as an inner loop or a high-frequency loop with respect to the outer loop. The outer loop can be referred to as the feedback loop (lower f), whereas the inner loop or nested loop 172 can be referred to as the open loop (high f). Thus, the nested loop 172 can be embedded in different areas of the outer loop.

The different between the circuit 150 and the circuit 170 is the reversal of the inductive elements A and B.

Figure 6:
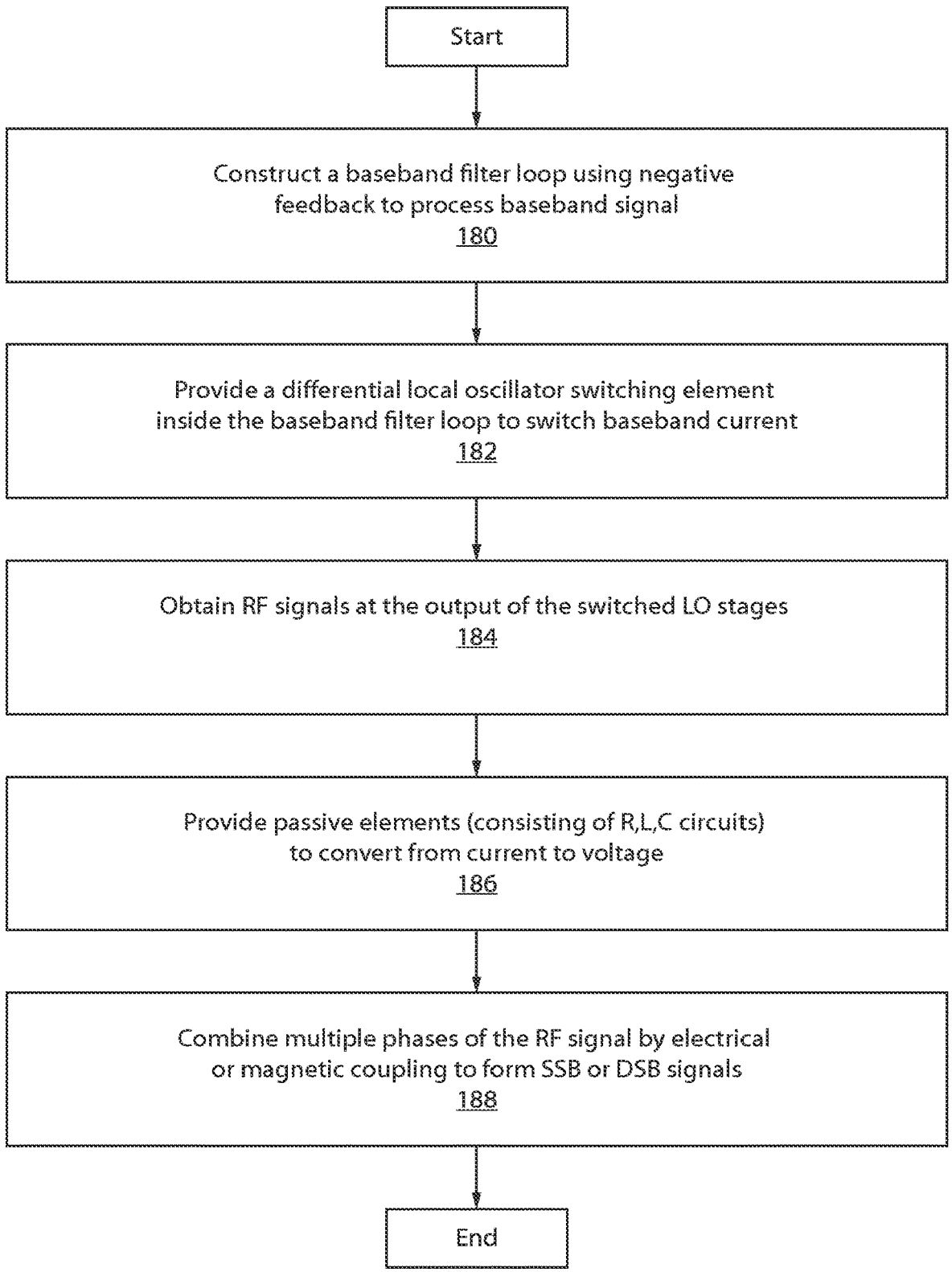
FIG. 6 illustrates a block-flow diagram of an exemplary method for powering sensor arrays with low power transmitters, in accordance with an embodiment of the present invention.

FIG. 6 is a block/flow diagram of an exemplary method for powering a plurality of sensor arrays with a low power transmitter, in accordance with an embodiment of the present invention.

At block 180, construct a baseband filter loop using negative feedback to process a baseband signal. The input to the baseband filter can be voltage or current. The output signal is current.

At block 182, provide a differential local oscillator (LO) switching element inside or within the baseband filter loop to switch baseband current.

At block 184, obtain radiofrequency (RF) signals at the output of the switched LO stages.

At block 186, provide passive elements (including R. L, C circuits) to convert from current to voltage.

At block 188, combine multiple phases of the RF signal by electrical or magnetic coupling to form single-sideband modulation (SSB) or double-sideband modulation (DSB) signals.

The advantages of the exemplary embodiments of the present invention include at least a fully modular transmitter interface, reconfigurable using software, a current mode interface using feedforward structure reconfigurable as needed by application and standard, employing a low supply voltage, no limitation on bandwidth, improvement on the energy efficiency of the sensor node, low latency, and bandwidth and center frequency scalable up to high GHz range. The low power transmitter includes a digital to analog converter (DAC), an upconverting mixer, and a driver amplifier where the output current from the DAC is provided to the mixer, the mixer provides an upconverted RF voltage proportional to the input current, the interfacing impedance between the DAC and the mixer is low impedance, the current sink can be adjusted using a digital code for compensating DC offset, the transmitter can be configured as a single sideband transmitter and the transmitter can be configured as a double sideband transmitter.

The advantages of the exemplary embodiments of the present invention further include low power transmitters (less than 5 mW) using cartesian transmitters, which provide greater signal fidelity in the case of both amplitude and phase modulations. The advantages of the exemplary embodiments of the present invention include at least low impedance interface for the DAC, thereby keeping low distortion from the DAC, LO leakage cancellation, and I/Q imbalance cancellation.

Figure 7:
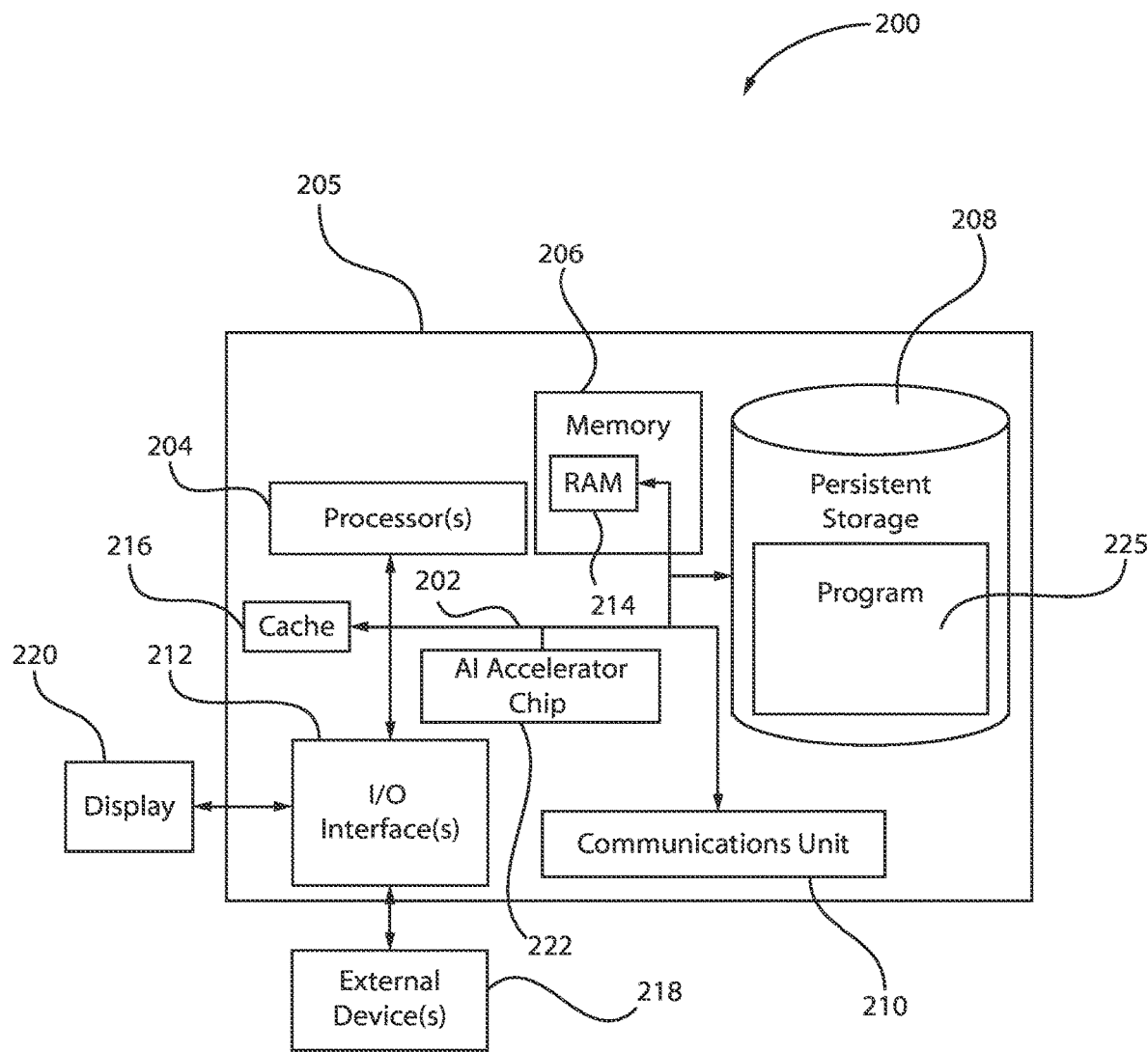
FIG. 7 is a block/flow diagram of an exemplary processing system employing an artificial intelligence (AI) accelerator chip, in accordance with an embodiment of the present invention.

FIG. 7 is a block/flow diagram of an exemplary processing system employing an artificial intelligence (AI) accelerator chip powered by low power transmitters, in accordance with an embodiment of the present invention.

FIG. 7 depicts a block diagram of components of system 200, which includes computing device 205. It should be appreciated that FIG. 7 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In another embodiment, the memory 206 can be flash memory. In general, memory 206 can include any suitable volatile or non-volatile computer readable storage media.

In some embodiments of the present invention, program 225 is included and operated by AI Accelerator chip 222 as a component of computing device 205. The AI Accelerator chip 222 can employ the low power transmitter 20, 45, 45' 45" to wirelessly power a plurality of communication devices and/or sensors, as described below with reference to FIGS. 10-12. In other embodiments, program 225 is stored in persistent storage 208 for execution by AI Accelerator chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

Figure 8:
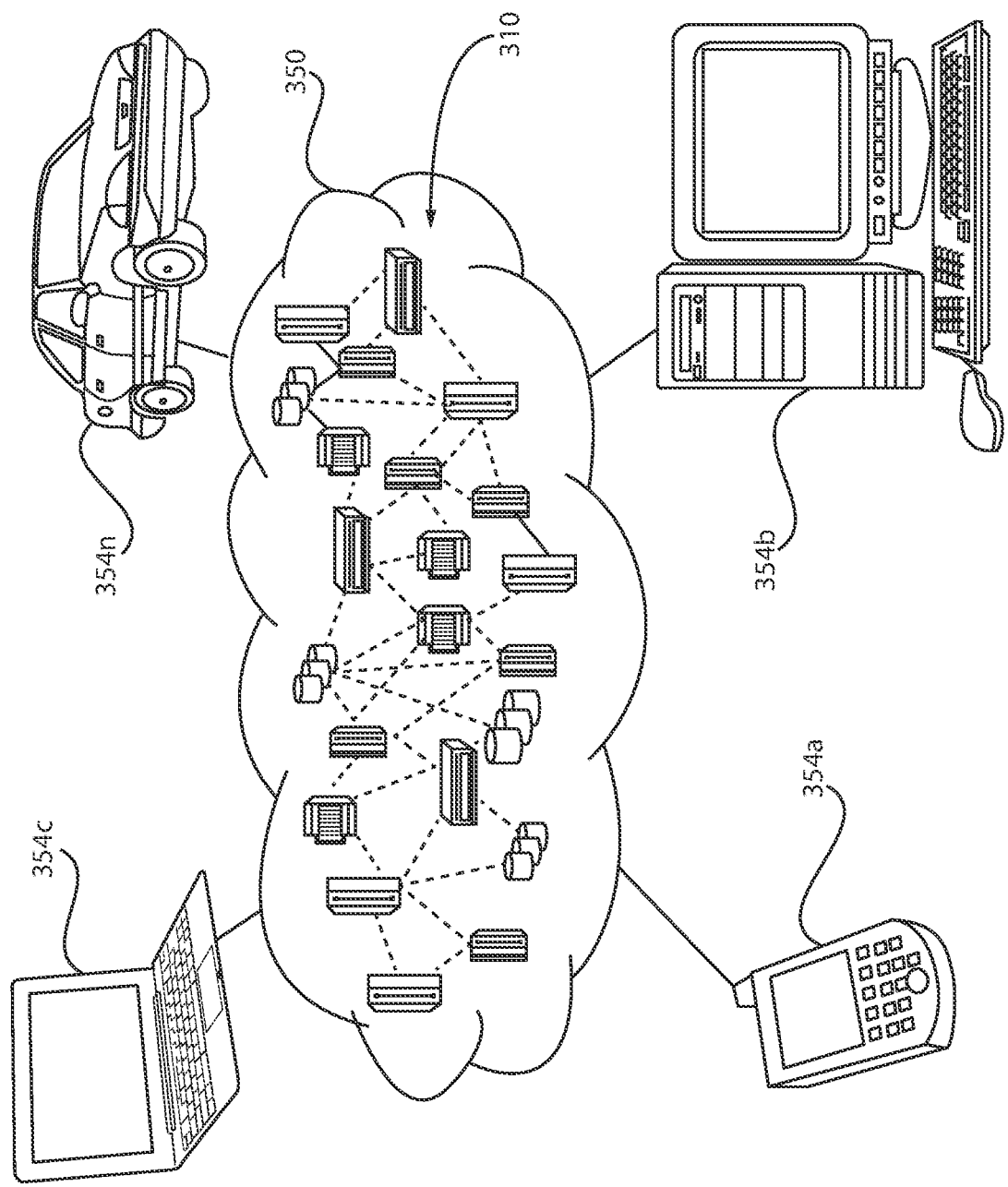
FIG. 8 is a block/flow diagram of an exemplary cloud computing environment, in accordance with an embodiment of the present invention.

FIG. 8 is a block/flow diagram of an exemplary cloud computing environment, in accordance with an embodiment of the present invention.

It is to be understood that although this invention includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 8, illustrative cloud computing environment 350 is depicted for enabling use cases of the present invention. As shown, cloud computing environment 350 includes one or more cloud computing nodes 310 with which local computing devices used by cloud consumers, such as, for example, personal digital assistant (PDA) or cellular telephone 354A, desktop computer 354B, laptop computer 354C, and/or automobile computer system 354N can communicate. Nodes 310 can communicate with one another. They can be grouped (not shown) physically or virtually, in one or more networks, such as Private, Community, Public, or Hybrid clouds as described hereinabove, or a combination thereof. This allows cloud computing environment 350 to offer infrastructure, platforms and/or software as services for which a cloud consumer does not need to maintain resources on a local computing device. It is understood that the types of computing devices 354A-N shown in FIG. 8 are intended to be illustrative only and that computing nodes 310 and cloud computing environment 350 can communicate with any type of computerized device over any type of network and/or network addressable connection (e.g., using a web browser).

Figure 9:
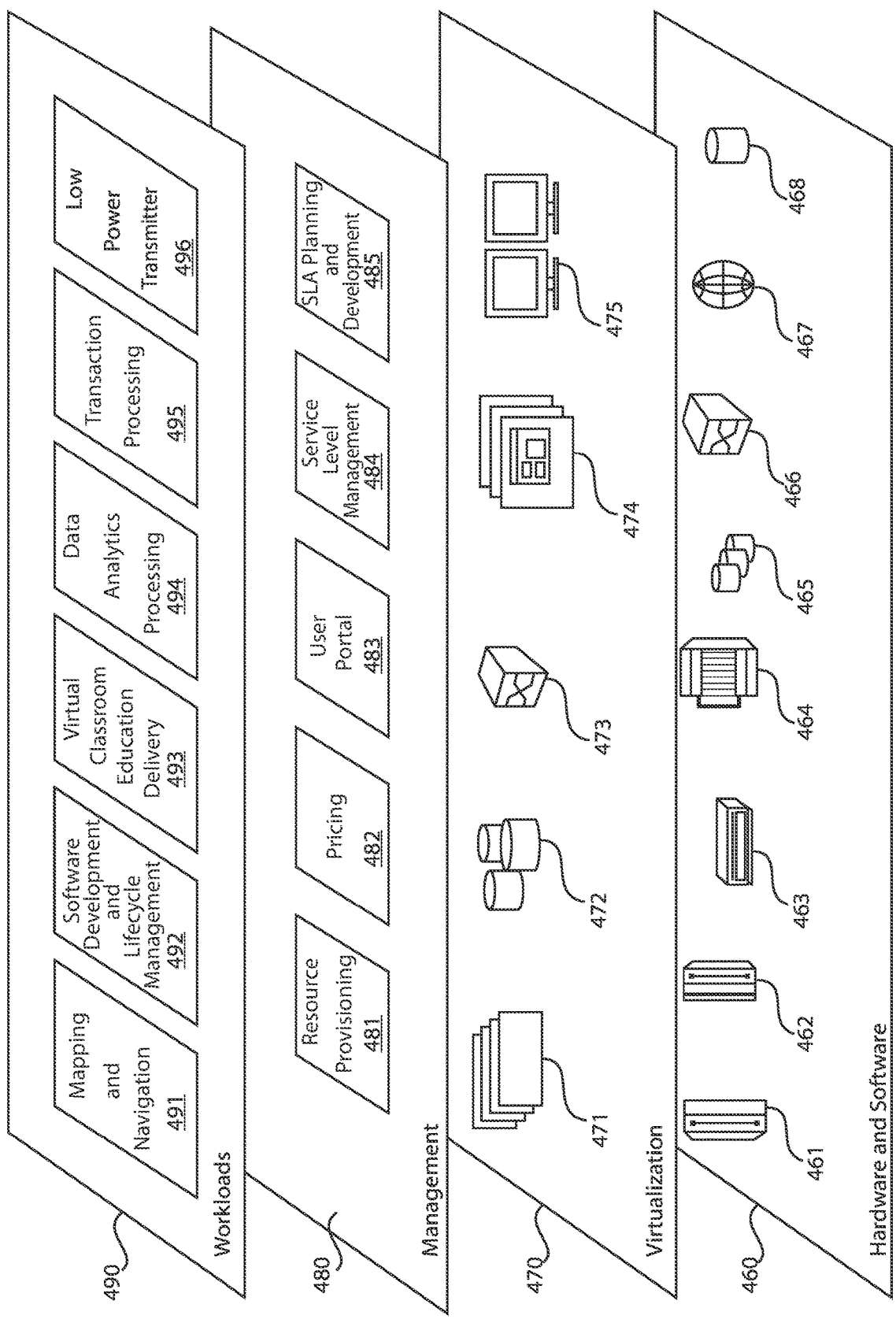
FIG. 9 is a schematic diagram of exemplary abstraction model layers, in accordance with an embodiment of the present invention.

FIG. 9 is a schematic diagram of exemplary abstraction model layers, in accordance with an embodiment of the present invention. It should be understood in advance that the components, layers, and functions shown in FIG. 9 are intended to be illustrative only and embodiments of the invention are not limited thereto. As depicted, the following layers and corresponding functions are provided:

Hardware and software layer 460 includes hardware and software components. Examples of hardware components include: mainframes 461; RISC (Reduced Instruction Set Computer) architecture based servers 462; servers 463; blade servers 464; storage devices 465; and networks and networking components 466. In some embodiments, software components include network application server software 467 and database software 468.

Virtualization layer 470 provides an abstraction layer from which the following examples of virtual entities can be provided: virtual servers 471; virtual storage 472; virtual networks 473, including virtual private networks; virtual applications and operating systems 474; and virtual clients 475.

In one example, management layer 480 can provide the functions described below. Resource provisioning 481 provides dynamic procurement of computing resources and other resources that are utilized to perform tasks within the cloud computing environment. Metering and Pricing 482 provide cost tracking as resources are utilized within the cloud computing environment, and billing or invoicing for consumption of these resources. In one example, these resources can include application software licenses. Security provides identity verification for cloud consumers and tasks, as well as protection for data and other resources. User portal 483 provides access to the cloud computing environment for consumers and system administrators. Service level management 484 provides cloud computing resource allocation and management such that required service levels are met. Service Level Agreement (SLA) planning and fulfillment 485 provide pre-arrangement for, and procurement of, cloud computing resources for which a future requirement is anticipated in accordance with an SLA.

Workloads layer 490 provides examples of functionality for which the cloud computing environment can be utilized. Examples of workloads and functions which can be provided from this layer include: mapping and navigation 491; software development and lifecycle management 492; virtual classroom education delivery 493; data analytics processing 494; transaction processing 495; and low power transmitter 496.

Figure 10:
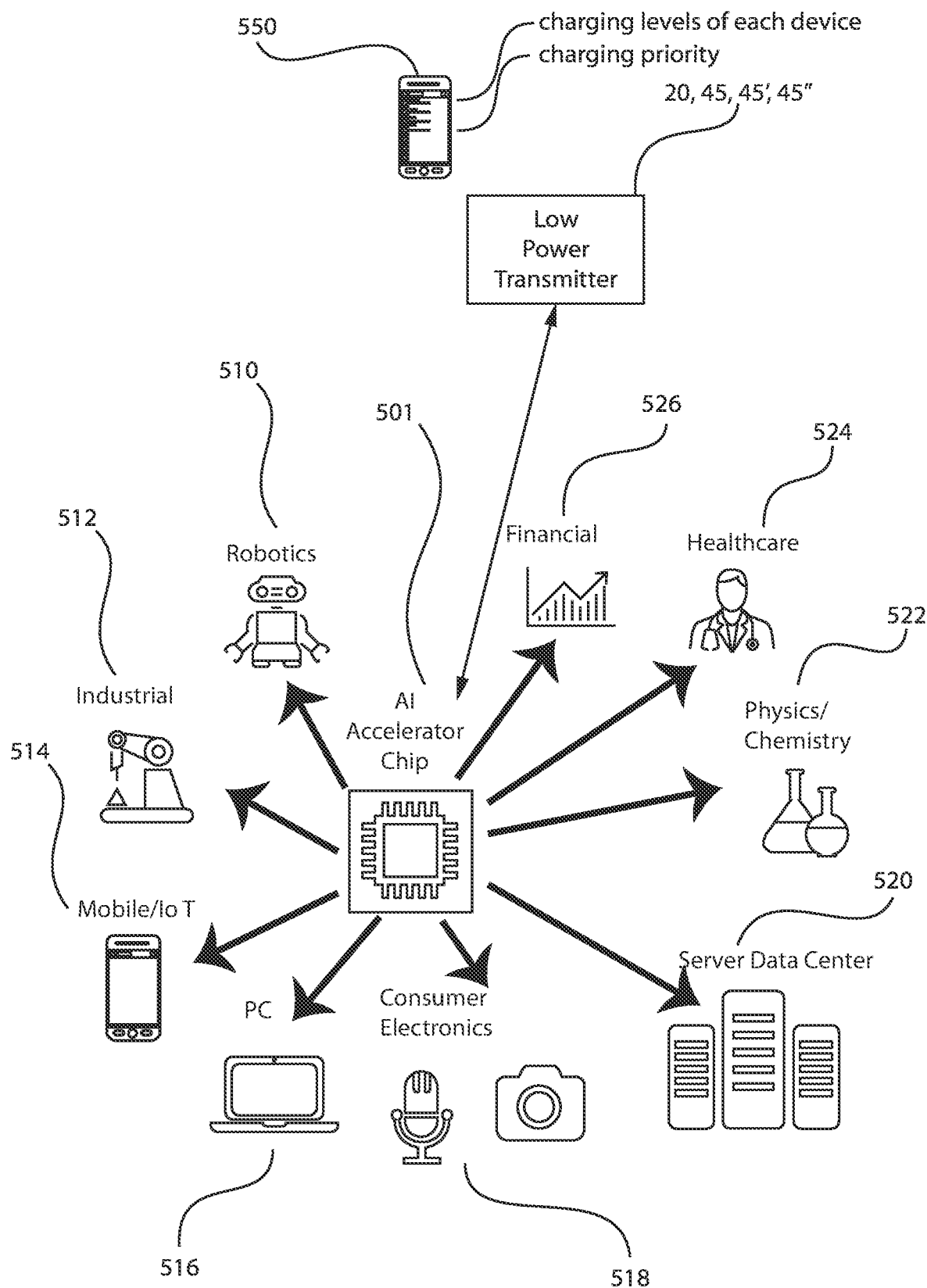
FIG. 10 illustrates practical applications for powering a plurality of sensor arrays via an AI accelerator chip, in accordance with an embodiment of the present invention.

FIG. 10 illustrates practical applications for powering a plurality of sensor arrays via an AI accelerator chip, in accordance with an embodiment of the present invention.

The artificial intelligence (AI) accelerator chip 501 can be used in a wide variety of practical applications, including, but not limited to, robotics 510, industrial applications 512, mobile or Internet-of-Things (IoT) 514, personal computing 516, consumer electronics 518, server data centers 520, physics and chemistry applications 522, healthcare applications 524, and financial applications 526. The AI accelerator chip 501 can be in communication with the low power transmitter 20, 45, 45', 45". The low power transmitter 20, 45, 45', 45" can be controlled by an electronic device or communication device 550, such as a smartphone or tablet, where, e.g., the charging levels of various devices can be controlled. Additionally, the charging priority status of each of the devices can also be controlled.

Moreover, the low power transmitter 20, 45, 45', 45" can be controlled based on a number of variables or parameters. For instance, each device (or sensor) within a cluster of devices (or sensors) can be charged based on its distance or proximity from the low power transmitter 20, 45, 45', 45". Additionally, each device (or sensor) within a cluster of devices (or sensors) can be charged based on its priority status. Some devices (or sensors) can have a higher priority status. Additionally, each device (or sensor) within a cluster of devices (or sensors) can be charged based on its charged percentage. In other words, if a cluster includes 10 devices (or sensors), then if 3-4 devices have already been charged at 60%, such devices can be put on hold, until the remaining devices have reached a 60% charge. Such custom configurations can be implemented by a user operating the electronic device 550 controlling the low power transmitter 20, 45, 45', 45". The low power transmitter 20, 45, 45', 45" can include, e.g., an app that allows a user to view the charging status of each device within each sensor cluster of the plurality of sensor clusters. The app can be configured to indicate what level to be charged for each device based on distance or priority or frequency, etc. One skilled in the art can contemplate a number of different configurations for automatically controlling the sensors (devices) of each sensor (device) cluster.

Figure 11:
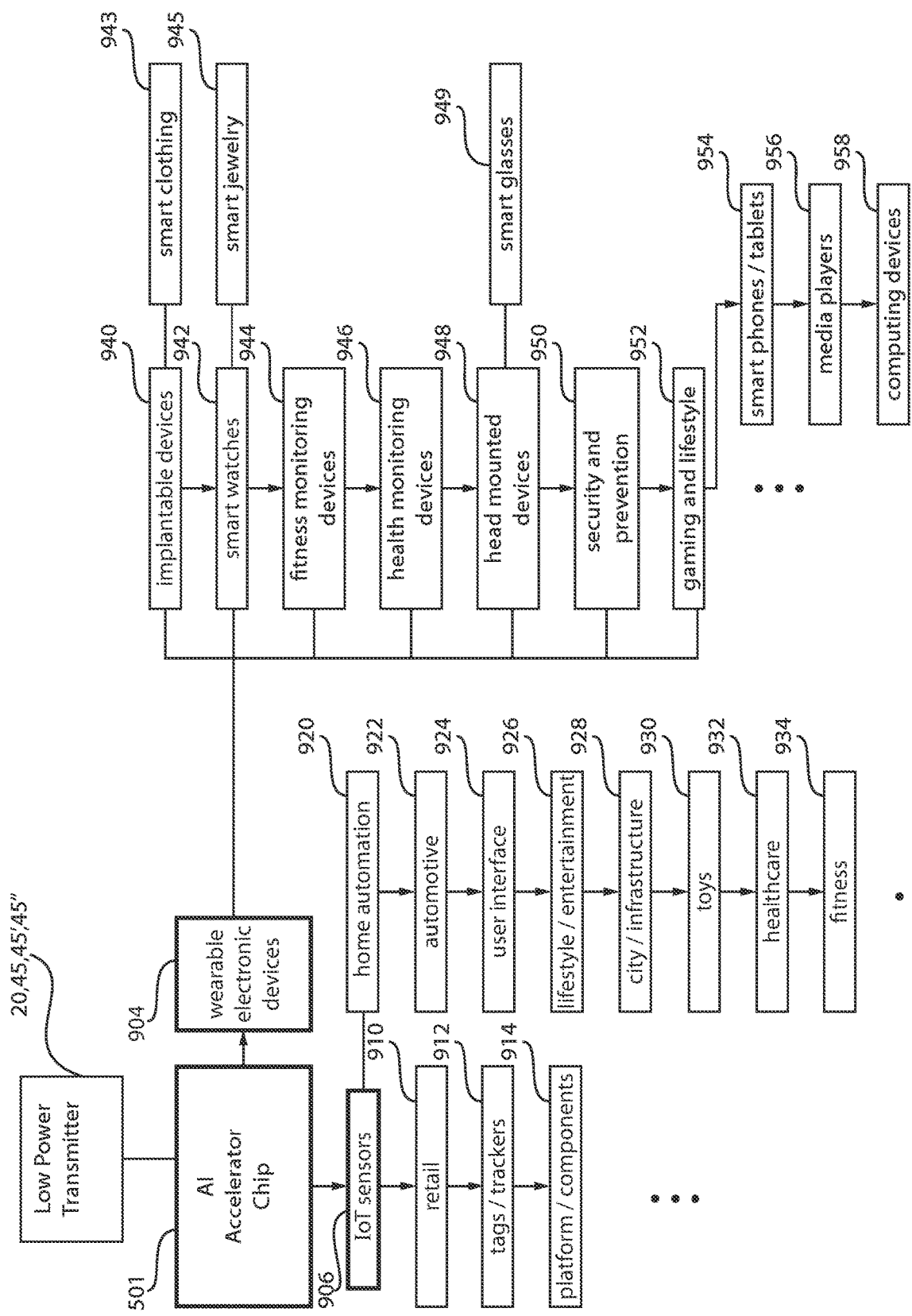
FIG. 11 is a block/flow diagram of a method for powering a plurality of sensors with Internet of Things (IoT) systems/devices/infrastructure, in accordance with an embodiment of the present invention.

FIG. 11 is a block/flow diagram of a method for powering a plurality of sensors with a low power transmitter with Internet of Things (IoT) systems/devices/infrastructure, in accordance with an embodiment of the present invention.

According to some embodiments of the invention, a network is implemented using an IoT methodology. For example, AI accelerator chip 222, 501 can be incorporated, e.g., into wearable, implantable, or ingestible electronic devices and Internet of Things (IoT) sensors. The wearable, implantable, or ingestible devices can include at least health and wellness monitoring devices, as well as fitness devices. The wearable, implantable, or ingestible devices can further include at least implantable devices, smart watches, head-mounted devices, security and prevention devices, and gaming and lifestyle devices. The IoT sensors can be incorporated into at least home automation applications, automotive applications, user interface applications, lifestyle and/or entertainment applications, city and/or infrastructure applications, toys, healthcare, fitness, retail tags and/or trackers, platforms and components, etc. The AI accelerator chip 222, 501 described herein can be incorporated into any type of electronic devices for any type of use or application or operation.

IoT systems allow users to achieve deeper automation, analysis, and integration within a system. IoT improves the reach of these areas and their accuracy. IoT utilizes existing and emerging technology for sensing, networking, and robotics. Features of IoT include artificial intelligence, connectivity, sensors, active engagement, and small device use. In various embodiments, the AI accelerator chip 222, 501 of the present invention can be incorporated into a variety of different devices and/or systems. For example, the AI accelerator chip 222, 501 can be incorporated into wearable or portable electronic devices 904. Wearable/portable electronic devices 904 can include implantable devices 940, such as smart clothing 943. Wearable/portable devices 904 can include smart watches 942, as well as smart jewelry 945. Wearable/portable devices 904 can further include fitness monitoring devices 944, health and wellness monitoring devices 946, head-mounted devices 948 (e.g., smart glasses 949), security and prevention systems 950, gaming and lifestyle devices 952, smart phones/tablets 954, media players 956, and/or computers/computing devices 958.

The AI accelerator chip 222, 501 of the present invention can be further incorporated into Internet of Thing (IoT) sensors 906 for various applications, such as home automation 920, automotive 922, user interface 924, lifestyle and/or entertainment 926, city and/or infrastructure 928, retail 910, tags and/or trackers 912, platform and components 914, toys 930, and/or healthcare 932, as well as fitness 934. The IoT sensors 906 can employ the AI accelerator chip 222, 501. Of course, one skilled in the art can contemplate incorporating such AI accelerator chip 222, 501 into any type of electronic devices for any types of applications, not limited to the ones described herein. The AI accelerator chip can be controlled or powered by the wireless power system 5, 80.

Figure 12:
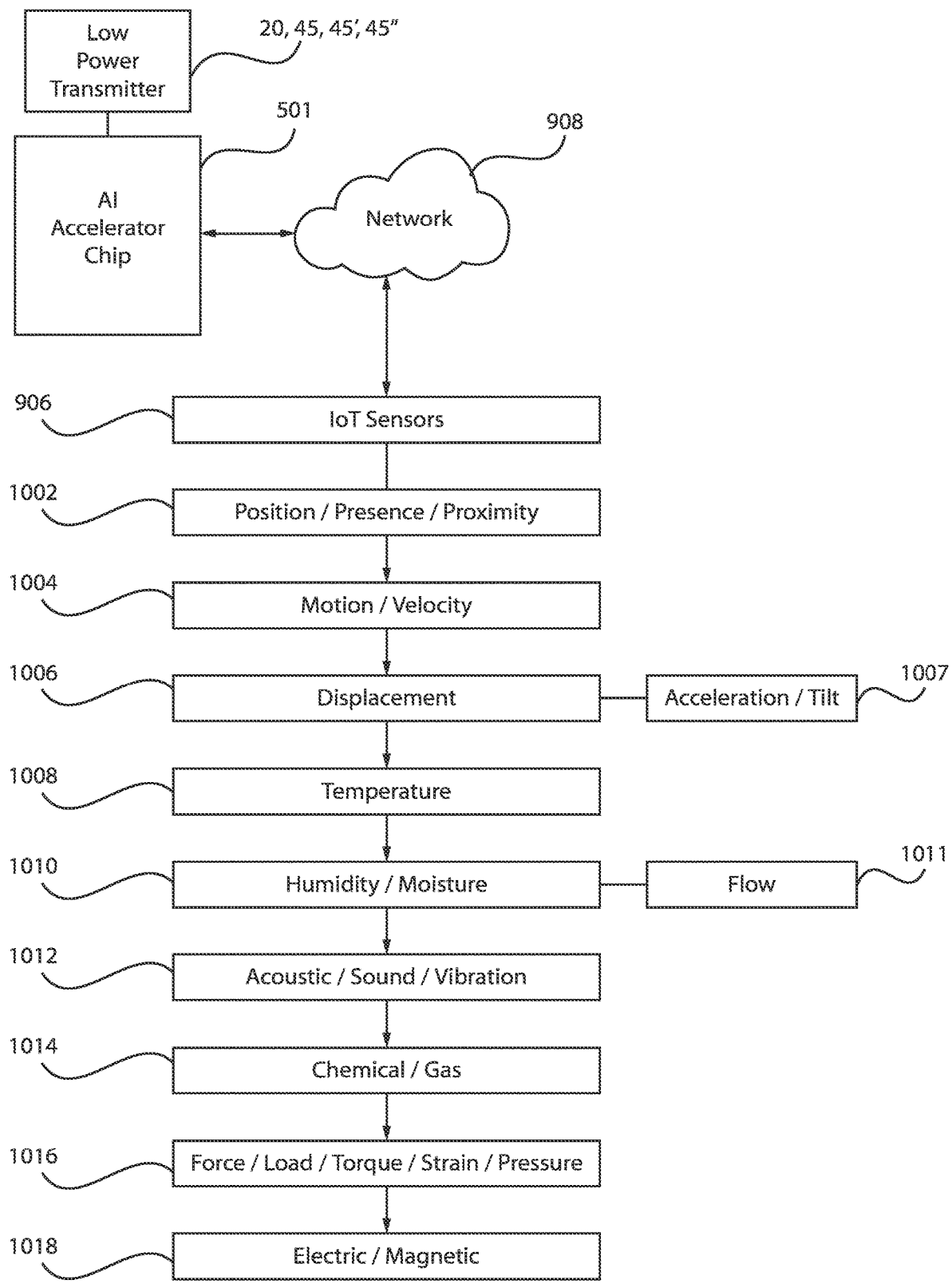
FIG. 12 is a block/flow diagram of exemplary IoT sensors used to collect data/information related to powering a plurality of sensors, in accordance with an embodiment of the present invention.

FIG. 12 is a block/flow diagram of exemplary IoT sensors used to collect data/information related to power a plurality of sensors with a low power transmitter, in accordance with an embodiment of the present invention.

IoT loses its distinction without sensors. IoT sensors act as defining instruments which transform IoT from a standard passive network of devices into an active system capable of real-world integration.

The IoT sensors 906 can employ the AI accelerator chip 222, 501 to transmit information or data, continuously and in in real-time, via a network 908, to any type of distributed system. Exemplary IoT sensors 906 can include, but are not limited to, position/presence/proximity sensors 1002, motion/velocity sensors 1004, displacement sensors 1006, such as acceleration/tilt sensors 1007, temperature sensors 1008, humidity/moisture sensors 1010, as well as flow sensors 1011, acoustic/sound/vibration sensors 1012, chemical/gas sensors 1014, force/load/torque/strain/pressure sensors 1016, and/or electric/magnetic sensors 1018. One skilled in the art can contemplate using any combination of such sensors to collect data/information of the distributed system for further processing. One skilled in the art can contemplate using other types of IoT sensors, such as, but not limited to, magnetometers, gyroscopes, image sensors, light sensors, radio frequency identification (RFID) sensors, and/or micro flow sensors. IoT sensors can also include energy modules, power management modules, RF modules, and sensing modules. RF modules manage communications through their signal processing, WiFi, ZigBee®, Bluetooth®, radio transceiver, duplexer, etc.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to at least one processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks or modules.

The computer readable program instructions can also be loaded onto a computer, other programmable data processing apparatus, or other device to cause a series of operational blocks/steps to be performed on the computer, other programmable apparatus or other device to produce a computer implemented process, such that the instructions which execute on the computer, other programmable apparatus, or other device implement the functions/acts specified in the flowchart and/or block diagram block or blocks or modules.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This can be extended, as readily apparent by one of ordinary skill in this and related arts, for as many items listed.

Having described preferred embodiments of a low power transmitter for powering sensor arrays (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A power transmitter comprising:
a frequency feedback loop;
a frequency switching element embedded within the frequency feedback loop; and
a mixer electrically communicating with the frequency feedback loop and the frequency switching element.

2. The power transmitter of claim 1, wherein the frequency switching element is a single ended high frequency switching element.

3. The power transmitter of claim 1, wherein the frequency switching element is a differential high frequency switching element.

4. The power transmitter of claim 1, wherein the frequency feedback loop employs a voltage mode interface.

5. The power transmitter of claim 1, wherein the frequency feedback loop employs a current mode interface.

6. The power transmitter of claim 1, wherein the frequency feedback loop includes a dominant pole and a non-dominant pole.

7. The power transmitter of claim 1, wherein the mixer is a single sideband mixer.

8. The power transmitter of claim 1, wherein the mixer is a double sideband mixer.

9. The power transmitter of claim 1, wherein the frequency switching element includes a first transistor, a second transistor, and a pair of inductive elements.

10. The power transmitter of claim 1, wherein the frequency switching element includes a single transistor and a single inductive element.

11. A method comprising:
powering a plurality of sensor arrays via a power transmitter by:
constructing a frequency feedback loop;
embedding a frequency switching element within the frequency feedback loop to switch a baseband current;
obtaining radiofrequency (RF) signals at an output of switched local oscillator (LO) stages of the power transmitter; and
electrically connecting a mixer with the frequency feedback loop and the frequency switching element to combine multiple phases of the RF signals by electrical or magnetic coupling.

12. The method of claim 11, wherein the frequency switching element is a single ended high frequency switching element.

13. The method of claim 11, wherein the frequency switching element is a differential high frequency switching element.

14. The method of claim 11, wherein the frequency feedback loop employs a voltage mode interface.

15. The method of claim 11, wherein the frequency feedback loop employs a current mode interface.

16. The method of claim 11, wherein the frequency feedback loop includes a dominant pole and a non-dominant pole.

17. The method of claim 11, wherein the frequency switching element includes a first transistor, a second transistor, and a pair of inductive elements.

18. The method of claim 11, wherein the frequency switching element includes a single transistor and a single inductive element.

19. A mixer of a power transmitter comprising:
a first feedback loop including a first op amp, a first transistor, a first switch connected between the first op amp and the first transistor, and a first resistive element;
a second feedback loop including a second op amp, a second transistor, a second switch connected between the second op amp and the second transistor, and a second resistive element; and
a third transistor electrically connected between the first and second resistive elements, such that a first feedback loop is defined with the first op-amp, the first transistor, the first resistive element and the third transistor, and a second feedback loop is defined with the second op-amp, the second transistor, the second resistive element and the third transistor.

20. The mixer of claim 19, wherein the first and second switches are switched using local oscillator (LO) waveforms and inputs to the first and second op amps are analog baseband signals.

* * * * *